(12) United States Patent
Pezeshki et al.

(10) Patent No.: US 8,000,368 B2
(45) Date of Patent: Aug. 16, 2011

(54) MODULATED SEMICONDUCTOR DFB LASER ARRAY WITH A MEMS-BASED RF SWITCH

(75) Inventors: Bardia Pezeshki, Redwood City, CA (US); Raghuram Narayan, Fremont, CA (US)

(73) Assignee: Santur Corporation, Fremont, CA (US)

( * ) Notice: Subject to any disclaimer, the term of this patent is extended or adjusted under 35 U.S.C. 154(b) by 176 days.

(21) Appl. No.: 11/829,075

(22) Filed: Jul. 26, 2007

(65) Prior Publication Data
US 2008/0025359 A1    Jan. 31, 2008

Related U.S. Application Data

(60) Provisional application No. 60/833,587, filed on Jul. 26, 2006.

(51) Int. Cl.
*H01S 5/00* (2006.01)
(52) U.S. Cl. ........... 372/50.12; 372/38.03; 372/38.05; 372/29.012; 372/29.014; 372/29.015; 372/26; 372/38.01
(58) Field of Classification Search ............. 372/50.12, 372/38.03, 26, 38.05, 38.1, 29.012, 29.014, 372/29.015
See application file for complete search history.

(56) References Cited

U.S. PATENT DOCUMENTS

| | | |
|---|---|---|
| 4,009,385 A | 2/1977 | Sell |
| 4,317,611 A | 3/1982 | Petersen |
| 4,359,773 A | 11/1982 | Swartz et al. |
| 4,796,266 A | 1/1989 | Banwell et al. |
| 5,136,598 A | 8/1992 | Weller et al. |
| 5,291,502 A | 3/1994 | Pezeshki et al. |
| 5,367,136 A * | 11/1994 | Buck .................. 200/600 |
| 5,378,330 A | 1/1995 | Li et al. |
| 5,394,489 A | 2/1995 | Koch |
| 5,412,675 A | 5/1995 | Odagawa |
| 5,504,609 A | 4/1996 | Alexander et al. |
| 5,612,968 A | 3/1997 | Zah |

(Continued)

FOREIGN PATENT DOCUMENTS
FR    2805092    8/2001
(Continued)

OTHER PUBLICATIONS

"MEMS OPtical Switch Production Test System" by Polytec PI, Inc, pp. 1-2.*
Daneman, M. J., et al., "Laser-to-Fiber Coupling Module Using a Micromachined Alignment Mirror", IEEE Photonics Technology Letters, vol. 8, No. 3, Mar. 1996 (pp. 396-398).
(Continued)

*Primary Examiner* — Jessica T Stultz
*Assistant Examiner* — Delma R Fordé
(74) *Attorney, Agent, or Firm* — Klein, O'Neill & Singh, LLP

(57) ABSTRACT

Many approaches to tunable lasers use an array of DFBs, where each element of the array has a different wavelength. In some operations one element of the array is activated at a time depending on the desired wavelength. For modulated applications, an RF voltage is applied to a specific element of the DFB array, generally using an RF switch. In standard configurations, the demands on the switch are relatively difficult, generally requiring low RF insertion loss and good high frequency performance to 10 GHz. The DFB arrays are generally common cathode or common anode, depending on the type of the substrate used to fabricate the devices. Described herein is an array with a common cathode or anode configuration using a MEMS based switch that shorts the selected laser to RF ground. With this topology, preferably the off-state capacitance should be low with the MEMS switch.

3 Claims, 6 Drawing Sheets

U.S. PATENT DOCUMENTS

| | | | |
|---|---|---|---|
| 5,629,790 A | 5/1997 | Neukermans et al. | |
| 5,771,253 A | 6/1998 | Chang-Hasnain et al. | |
| 5,953,359 A | 9/1999 | Yamaguchi et al. | |
| 5,969,479 A | 10/1999 | Wong | |
| 5,977,567 A | 11/1999 | Verdiell | |
| 5,987,044 A | 11/1999 | Odagawa et al. | |
| 5,999,303 A | 12/1999 | Drake | |
| 6,091,537 A | 7/2000 | Sun et al. | |
| 6,091,747 A | 7/2000 | Morita et al. | |
| 6,201,629 B1 | 3/2001 | McClelland et al. | |
| 6,469,677 B1* | 10/2002 | Schaffner et al. | 343/876 |
| 6,516,017 B1 | 2/2003 | Matsumoto | |
| 6,553,044 B1 | 4/2003 | Eden | |
| 6,563,849 B2 | 5/2003 | Mizuno | |
| 6,639,924 B2 | 10/2003 | Kato et al. | |
| 6,754,243 B2* | 6/2004 | Missey et al. | 372/20 |
| 6,795,453 B2* | 9/2004 | Pezeshki et al. | 372/20 |
| 6,801,002 B2* | 10/2004 | Victor et al. | 315/169.3 |
| 6,816,529 B2 | 11/2004 | Vail et al. | |
| 6,914,916 B2* | 7/2005 | Pezeshki et al. | 372/15 |
| 6,922,278 B2* | 7/2005 | Vail et al. | 359/320 |
| 2001/0036206 A1 | 11/2001 | Jerman et al. | |
| 2001/0050928 A1* | 12/2001 | Cayrefourcq et al. | 372/12 |
| 2002/0064192 A1 | 5/2002 | Missey et al. | |
| 2002/0181533 A1* | 12/2002 | Vail et al. | 372/50 |
| 2002/0183002 A1* | 12/2002 | Vail et al. | 455/10 |
| 2003/0002550 A1* | 1/2003 | Schemmann et al. | 372/38.02 |
| 2010/0090902 A1* | 4/2010 | Thompson et al. | 343/700 MS |
| 2010/0103402 A1* | 4/2010 | Inoue | 355/74 |

FOREIGN PATENT DOCUMENTS

| | | |
|---|---|---|
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |

OTHER PUBLICATIONS

Jacques, S., "Phase conjugate mirror and diffraction grating yield stable, collimated, coherent, high-power diode laser.", Oregon Medical Laser Center Newsletter, http://omlc.ogi.edu/news/dec97/pclaser.html, printed Apr. 9, 2001, (2 pages).

Kopka, P., et al., "Bistable 2×2 and Multistable 1×4 Micromechanical Fibre-optic Switches on Silicon", Micro Opto Electro Mechanical Systems, MOEMS 1999 (4 pages).

Li, G.P., et al., "16-Wavelength Gain-Coupled DFB Laser Array with Fine Tunability", IEEE Photonics Technology Letters, vol. 8, No. 1 Jan. 1996 (pp. 22-24).

Liu, F., et al., "Cost-effective wavelength selectable light source using DFB fibre laser array", Electronics Letters, vol. 36, No. 7, Mar. 30, 2000, pp. 620-621, (3 pages).

Maluf, N., "Optical switches", An Introduction to Microelectromechanical Systems Engineering, 2000, pp. 187-190 (3 pages).

Mercado, L.L., et al., "Mechanics-based solutions to RF MEMS switch stiction problem", IEEE Transactions on Components and Packaging Technologies, vol. 27, Issue 3, Sep. 2004 p. 560-567.

Sahlén, O., "DWDM Lasers Fashion Networks of the Future", FibreSystems, Sep. 1999 (pp. 41-44).

Pezeshki, B., et al., "12nm tunable WDM source using an integrated laser array", Electronics Letters, vol. 36, No. 9, Apr. 27, 2000 (pp. 788-789).

Solgaard, O., et al., "Optoelectronic Packaging Using Silicon Surface-Micromachined Alignment Mirrors", IEEE Photonics Technology Letters, vol. 7, No. 1, 1995 (pp. 41-43) (4 pages total).

Wu, M., "Micromachining for Optical and Optoelectronic Systems", Proceedings of the IEEE, vol. 85, No. 11, Nov. 1997 (pp. 1833, 1943-1952).

* cited by examiner

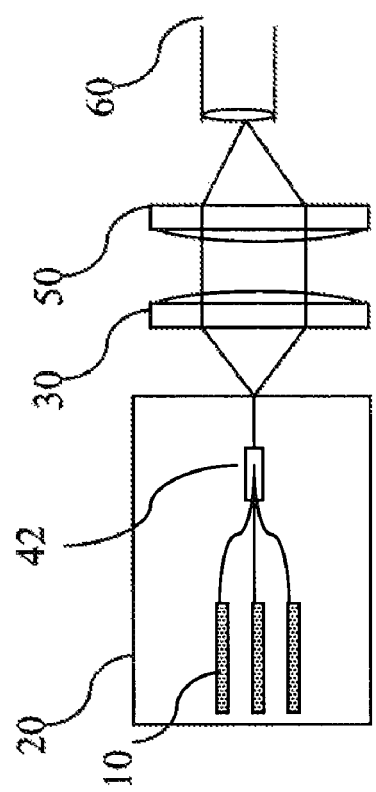
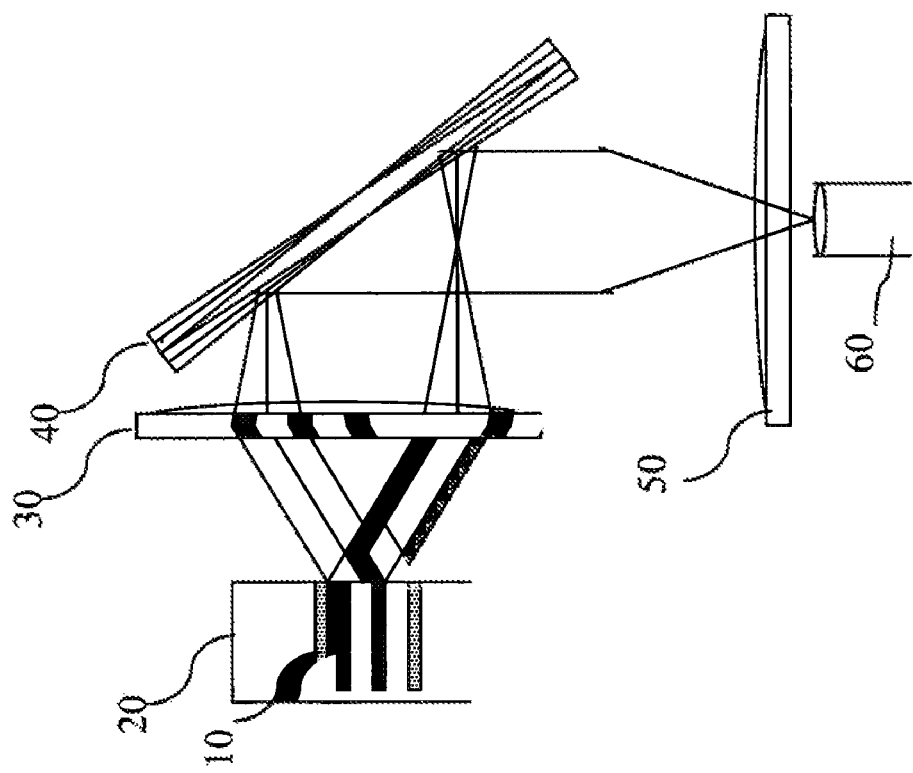
Fig. 1b
Fig. 1a

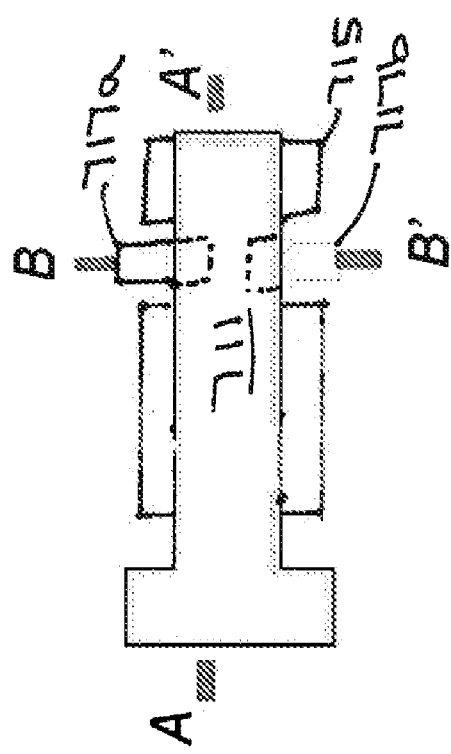
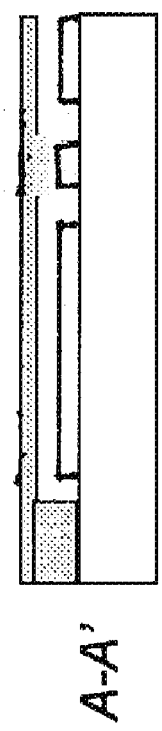
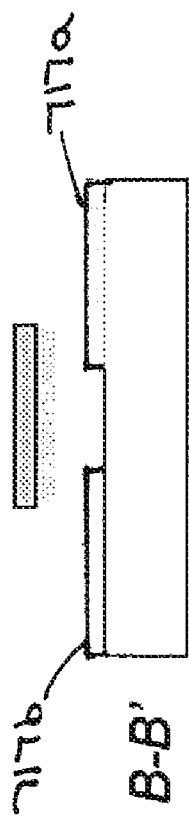
Fig. 6a
Fig. 6b
Fig. 6c

MODULATED SEMICONDUCTOR DFB LASER ARRAY WITH A MEMS-BASED RF SWITCH

CROSS-REFERENCE TO RELATED APPLICATION(S)

This application claims the benefit of the filing date of U.S. Provisional Patent Application No. 60/833,587, filed Jul. 26, 2006, the disclosure of which is incorporated by reference herein.

BACKGROUND OF THE INVENTION

The present invention relates generally to lasers for optical communication systems, and more particularly to direct modulation of a selected laser of an array of lasers for an optical communication system.

Semiconductor lasers are used for generating the light that carries data in fiber-optic systems. The most common form of laser for long distance fiber optic communication is the distributed feedback (DFB) laser. In a DFB laser a diffraction grating is embedded in the laser and controls the wavelength of light emitted by the laser. DFB lasers can be made single mode and have narrow linewidths and excellent low noise characteristics, appropriate for fiber optic applications.

Most of the demanding long distance fiber optic links use lasers of different wavelengths, as multiple channels, each at a different wavelength, are transmitted through the fiber simultaneously. A tunable laser that can be configured for any channel is therefore very useful.

A number of configurations for tunable lasers use an array of DFB lasers integrated on the same substrate. Each DFB laser has a different grating pitch and therefore lases, or emits light, at a different wavelength. To select light of a particular wavelength (understanding that the light may include other wavelengths depending on for example linewidth), one laser, or element, of the array is activated and light from the selected laser is coupled to the optical fiber. In many applications, the DFB laser runs continuous wave (CW), that is provides a steady source of light, and the modulation is applied afterwards using a lithium niobate Mach Zehnder modulator or an electro-absorptive device. However, in lower cost applications, it may be desirable to apply the modulation directly to the DFB laser.

Applying modulation to one element of the DFB laser array with an electronic transistor based radio frequency (RF) switch generally requires a high performance switch as well as an array of bypass capacitors and inductors, making the laser subassembly complex and difficult to use. The insertion loss of the switch at high frequencies also limits performance of systems incorporating the switch.

SUMMARY OF THE INVENTION

An aspect of the invention provides a simple and practical method to apply RF modulation to one element of a laser array. Preferably rather than a transistor based switch using MESFET or SiGe technology for good high frequency response, a microelectromechanical system (MEMS) based-switch, for example a cantilever switch, is used that simply shorts a specific DFB contact to the RF ground. In some embodiments this uses only a single RF bypass capacitor, inductor, and matching resistor.

In one aspect the invention provides a directly modulated DFB laser array where the RF signal is applied to the common electrode of the array and a micromechanical switch element grounds one of the laser leads to RF ground to select that particular laser element. In another aspect the invention provides a directly modulated laser array with a microelectromechanical switch, comprising a laser array on a substrate; and a micromechanical switch for allowing provision of an activation signal to a selected laser of the laser array. In another aspect the invention provides a laser array configured for selectable directly modulated lasers, comprising a plurality of lasers on a substrate; a DC bias source providing a DC current; a data signal source providing a data signal; and an array of microelectromechanical switches, each microelectromechanical switch of the array of microelectromechanical switches coupled to a corresponding laser of the plurality of lasers. In yet another aspect the invention provides a directly modulated laser array, comprising a plurality of lasers on a common substrate; and a microelectromechanical switch configured to selectively couple at least one of the plurality of lasers in a signal path.

These and other aspects of the invention are more fully comprehended upon review of this disclosure.

BRIEF DESCRIPTION OF THE DRAWINGS

FIG. 1a illustrates a first configuration for a tunable laser;
FIG. 1b illustrates a second configuration for a tunable laser;
FIGS. 6a-c illustrate an embodiment of a MEMS RF switch.

DETAILED DESCRIPTION

Figure 2:
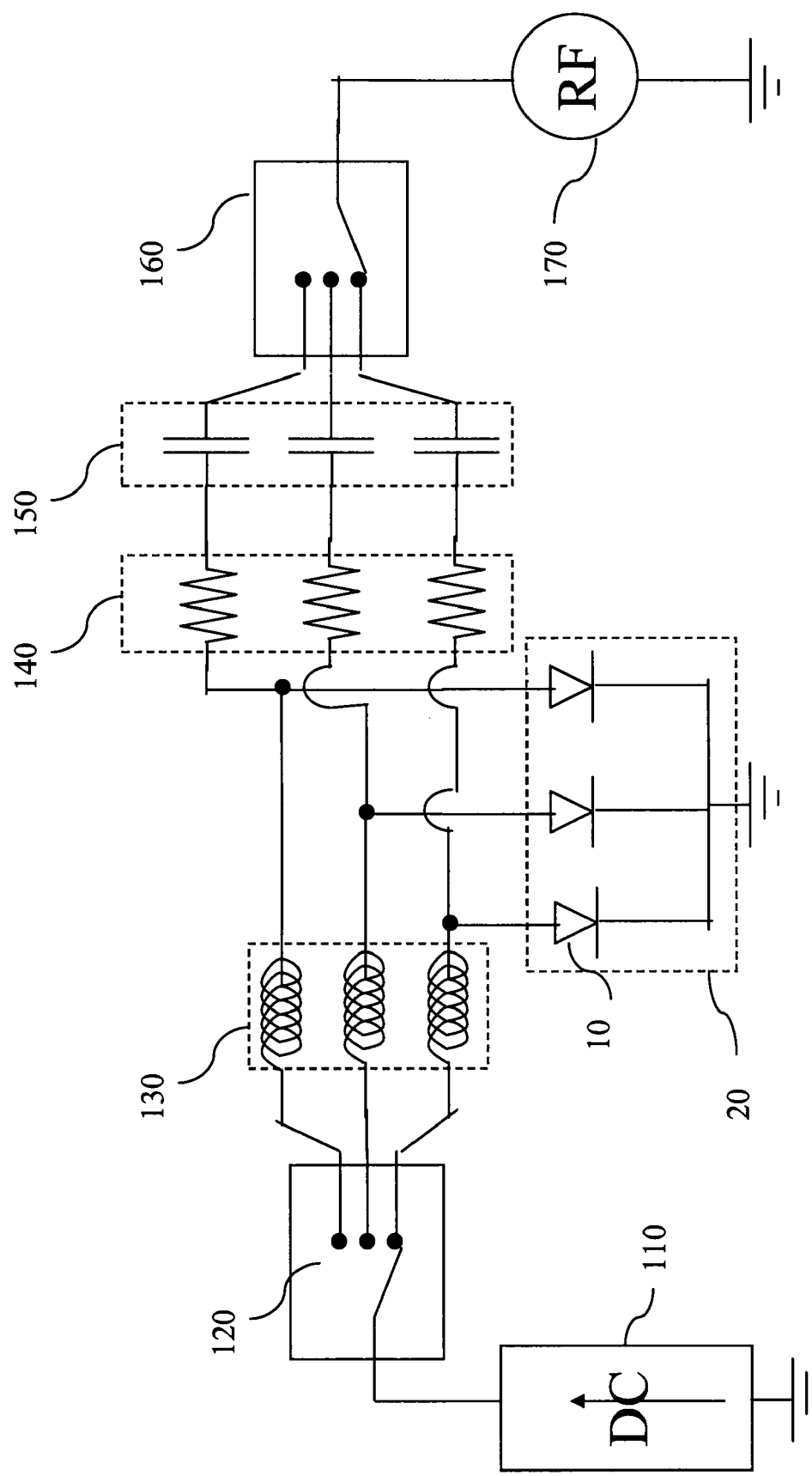
FIG. 2 is a schematic of shows a directly modulated tunable laser with an RF switch.

FIGS. 1a and 1b show two configurations for tunable lasers using a DFB laser array. In some embodiments lasers in the array are other than DFB lasers. For example, in some embodiments, the lasers are DBR lasers or other lasers, and in some embodiments the lasers are VCSELs.

FIG. 1a shows a first configuration for a tunable laser using an array of lasers. In the first configuration a moveable mirror 40 switches light from a selected laser of an array of lasers 10 into a fiber 60. Generally, the movable mirror tilts to couple the correct beam into the fiber. As shown in FIG. 1a the lasers are on a common substrate 20, with a beam emitted by the laser collimated by a first lens 30 between the lasers and the mirror and focused into the fiber by a second lens 50 between the mirror and the fiber.

FIG. 1b shows a second configuration for a tunable laser using an array of lasers. In the second configuration an integrated combiner 42 is used to provide light from lasers in an array of lasers 10 to a fiber 60. The integrated combiner is lithographically defined on the laser chip in most embodiments. As in the configuration of FIG. 1a, the lasers are on a common substrate 20 and light from the lasers is collimated by a first lens 30 and focused into the fiber by a second lens 50. Generally only a single laser of the array is activated at a given time, and accordingly light collimated and focused by the lenses and received by the fiber is light from only the activated laser. In addition, in various embodiments different combinations of lenses may be used, or even a single lens in some embodiments.

In most embodiments of the configurations of FIGS. 1a and 1b each individual laser in the array of lasers emits light at a different wavelength than other lasers in the array of lasers. In addition, in FIGS. 1a and 1b only three elements of the DFB laser array are shown. Typically the number is about 12, and the devices are temperature tuned in order to achieve any of about 80 wavelengths in a main communication band.

For a directly modulated application, when using an array of lasers, an RF modulation signal generally is switched to a selected laser as well as a DC bias signal. As shown in FIG. 2, a DC current source 110 provides a current that is switched with a low frequency switch 120 through bypass inductors 130 to a laser array 10, with the laser array on a common substrate 20. The switch 120 provides the current to a selected laser of the laser array, with the selected laser dependent on the state of the switch. An RF source provides a data or modulation signal that is switched by an RF switch 160 through bypass capacitors 150 and matching resistors 140 to the selected laser, so the selected laser receives both the bias current and the modulation signal. The inductors generally decouple the RF from the DC parts of the circuit and prevent the RF from being lost into the DC source.

This configuration is relatively complex with a DC current switch, an RF switch, an array of capacitors, an array of inductors, and an array of matching resistors. Moreover, a typical RF switch for this application, such as the Hittite Microwave Corporation GaAs based MESFET switch, has an insertion loss of up to 3 dB at 10 Gb/s.

Figure 3:
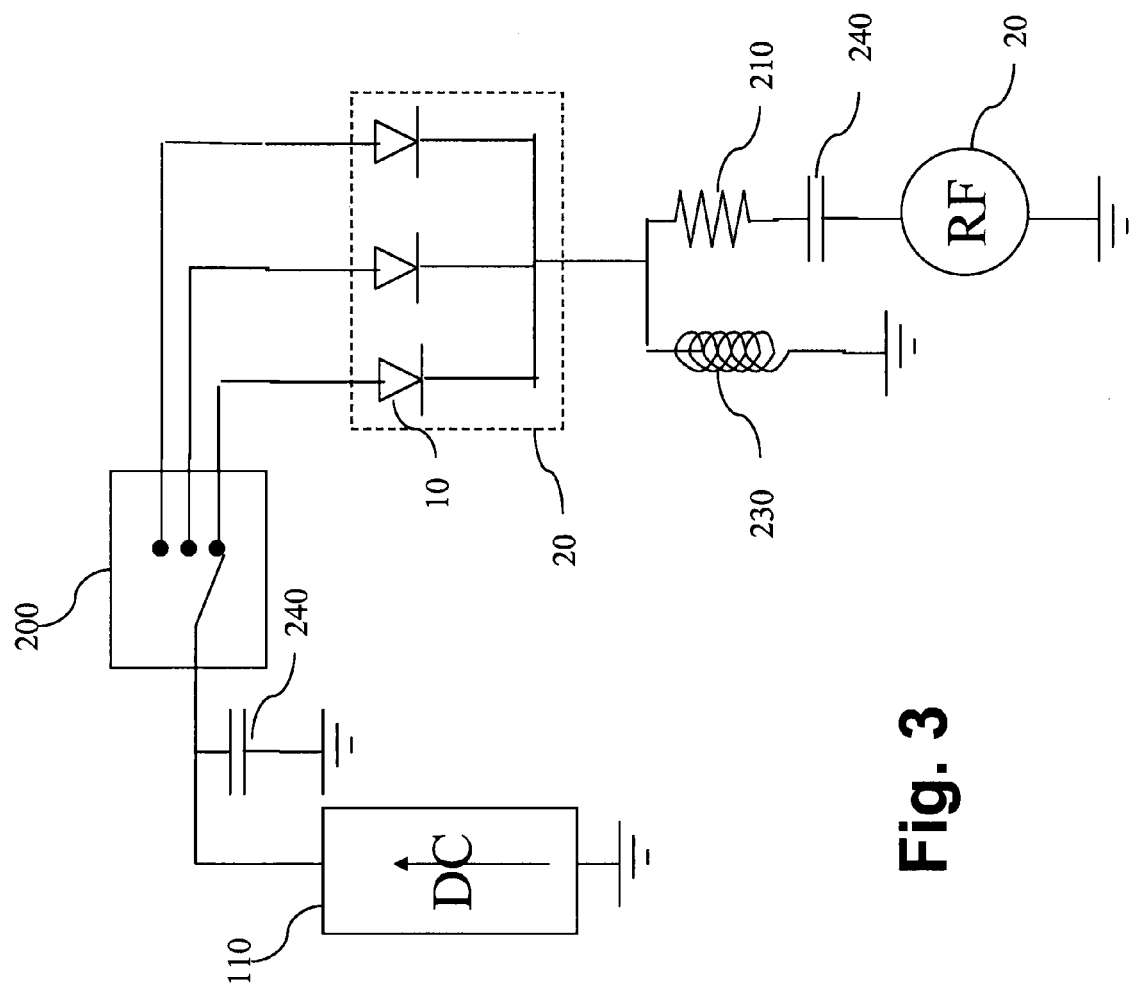
FIG. 3 is a schematic a directly modulated tunable laser with a MEMS RF switch.

FIG. 3 shows a circuit configuration using a MEMS RF switch 200. A laser array 10 on a common substrate 20 receives an RF signal from an RF signal source 20 and a DC bias signal from a DC signal source 110, with as illustrated the DC source coupled to laser anodes and the RF signal source coupled to laser cathodes. The DC signal source provides a DC bias signal, a DC current, to the laser array with the laser receiving the DC current dependent on the state of the MEMS RF switch. The RF signal source provides a data or modulation signal to the laser array.

A bypass capacitor 240 couples a signal line between the DC source and the MEMS RF switch to ground. The bypass capacitor also serves as the return pathway for the high speed RF signal. Accordingly, the laser effectively receiving the RF signal is also dependent on the state of the switch, with the switch selectively coupling the DC bias signal and the RF modulation signal to a selected laser (with the other lasers open circuited). In addition, as the MEMS RF switch can conduct DC as well as RF, no other additional integrated circuit may be required to perform switching functions. In addition, as illustrated a matching resistor 210 and a coupling capacitor 240 couple the RF signal source to the laser array, and an inductor 230 DC couples the laser cathodes to ground. In most embodiments, unlike the previously described configuration, only a single element of each type is used rather than an array of each type of element.

Thus, in the embodiment of FIG. 3, the RF signal goes through the matching (termination) resistor through the laser array and down to ground through the MEMS RF switch, while the DC first goes through the MEMS RF switch, through the array and then to ground through the inductor. This greatly simplifies the circuit compared to the layout of for example FIG. 2.

Figure 4:
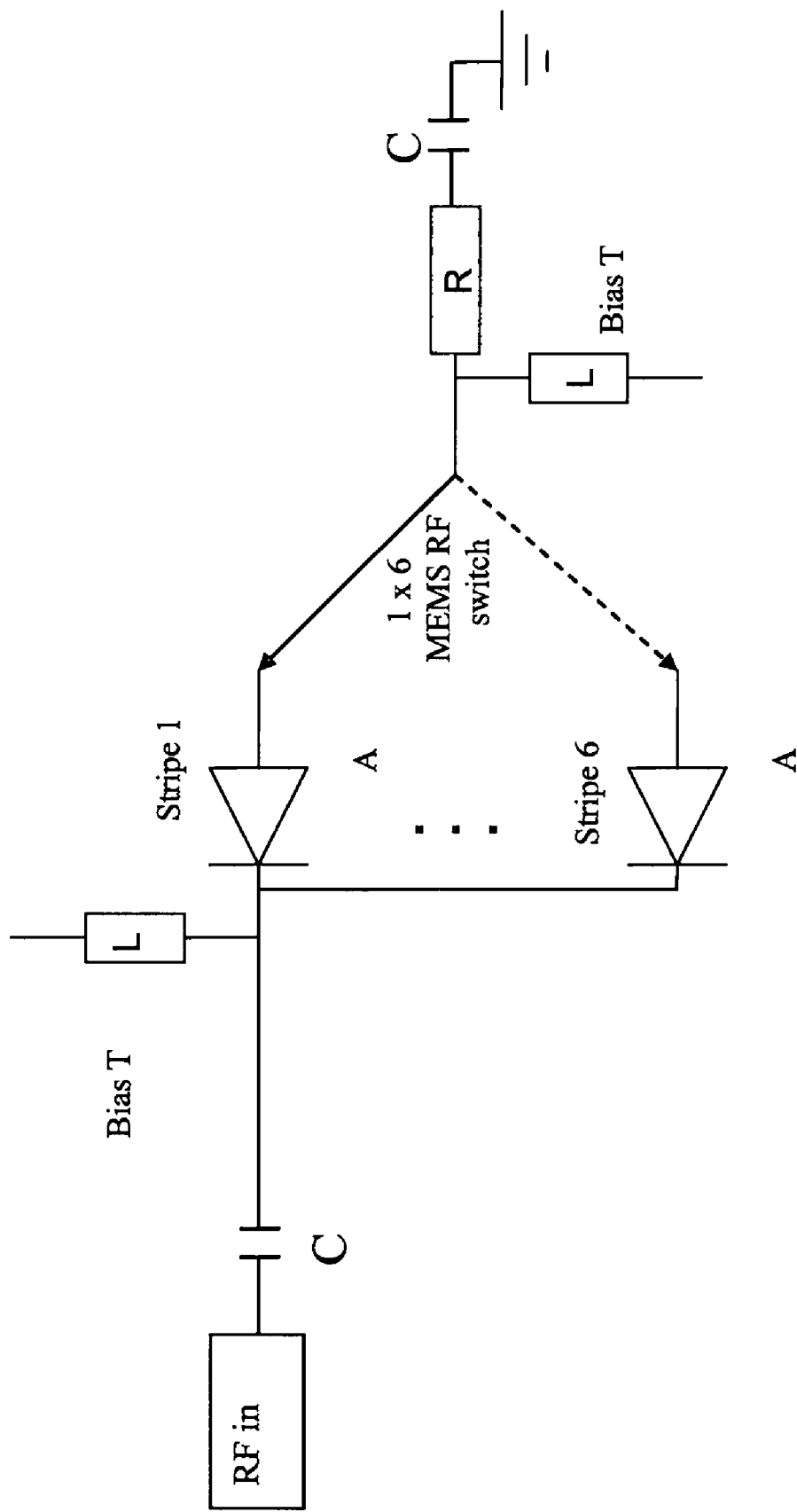
FIG. 4 is a semi-schematic/semi-block diagram of a further embodiment of a directly modulated tunable laser with a MEMS RF switch.

FIG. 4 shows portions of another implementation of directly modulated laser array, for example for 10 Gbps systems. In the embodiment of FIG. 4 a laser array 411 is configured to receive a modulation signal from an RF source 413 and a bias signal from a DC source (not shown). The RF source is coupled, as illustrated, to laser cathodes of the laser array, with a bias T circuit 415 between the RF source and the laser cathodes and the RF source AC coupled to the lasers by the bias T circuit. Anodes of the lasers of the laser array are selectively coupled to a further bias T circuit 417 by a MEMS RF switch 419. In most embodiments the DC source is coupled to a DC port of the further bias T circuit 417. The AC port of the further bias T circuit is coupled to ground, to complete the RF portion of the circuit.

The embodiment of FIG. 4 also has a matching (termination) resistance approximate the end of the transmission line following the laser and RF switch. Often the inductance in the RF pathway increases as the physical distance between the matching (termination) resistor and ground is increased, degrading bandwidth and return loss of the RF pathway, and the RF signal integrity may be degraded. The size of the RF MEMS switch, which is in the RF pathway, hence affects the signal integrity of the optical signal. The embodiment of FIG. 4, therefore is believed to allow for larger MEMS chip size for high data frequency applications. The RF MEMS switch may be designed to offer a characteristic impedance of 50 Ohms or 25 Ohms depending the RF driver used in the application, and the termination resistance may be a 45 Ohm resistor. This configuration for the modulated laser to appear electrically as a matched transmission line yielding high bandwidth and low return loss.

The laser diode appears as a capacitor for high frequency RF signals even when it is not turned on. As a result, in the architectures shown in FIGS. 3 and 4, the laser stripes that are not turned on appear as short stubs in the RF signal pathway. The total length of this parasitic stub is the sum of the length of the wire bond and the length of the trace on the MEM's chip to the switch element. The presence of stubs can cause parasitic resonances that will impact the RF signal integrity and necessitates the use of extremely short wire bonds between the laser chip and MEM's chip.

Figure 5:
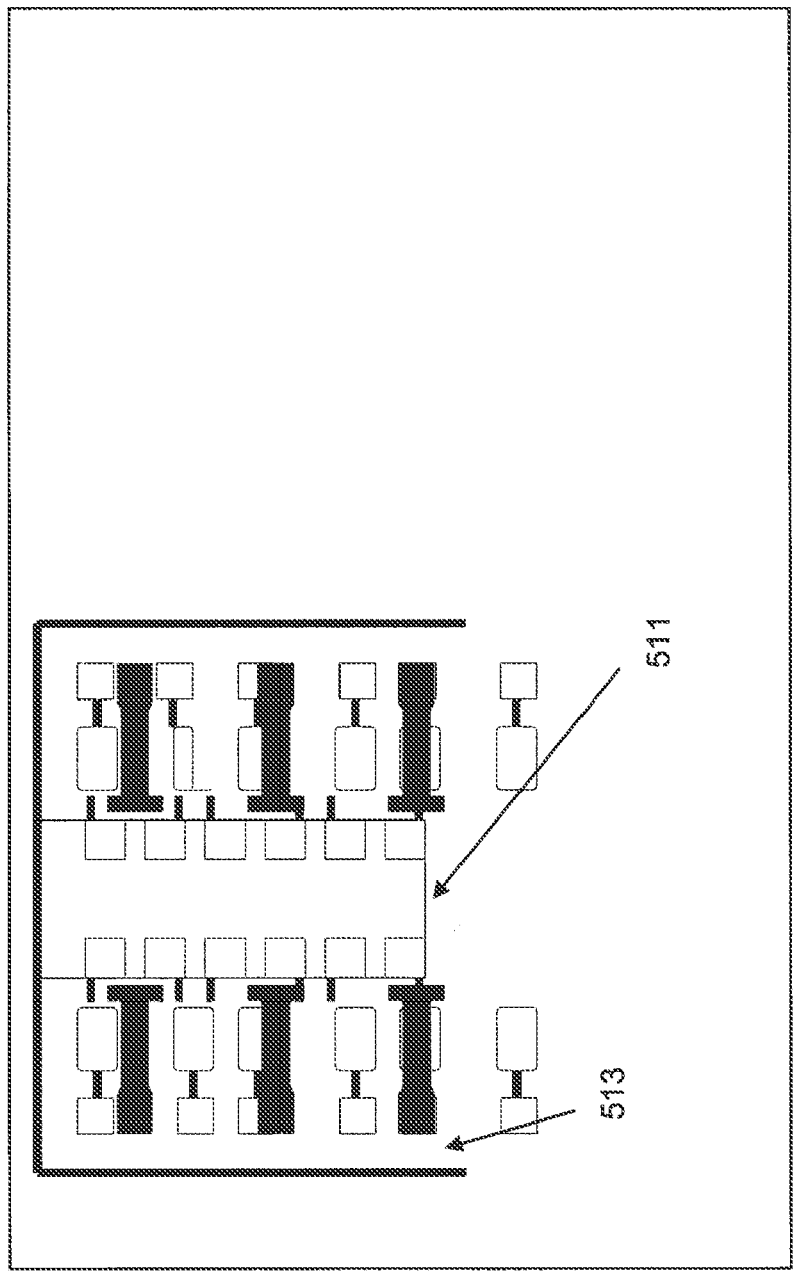
FIG. 5 illustrates a laser chip flip chip mounted on a MEMS switch chip.

FIG. 5 shows a laser chip 511 mounted in flip chip fashion on a MEMS chip 513 directly. In this case, the MEMS chip makes contact with the individual lasers from the bottom side. This design is believed to further reduce parasitic inductive discontinuity in the RF signal path.

The RF MEMS switch is in many embodiments a moveable cantilever based component, available from a number of sources, although other structures may be used in various embodiments. A characteristic that is believed desirable is a low off state capacitance and the ability to conduct DC as well as AC. FIGS. 6a-c show an implementation of such a simple two port RF switch, such as discussed in "Mechanics-based solutions to RF MEMS switch stiction problem", Mercado, L. L.; Kuo, S.-M.; Lee, T.-Y. T.; Lianjun Liu; IEEE Transactions on Components and Packaging Technologies, Volume 27, Issue 3, September 2004 p. 560-567, incorporated by reference herein. A cantilever 711 is free to move in a y-direction. The cantilever is electrostatically actuated to move towards a substrate 713 by application of a high voltage to a pad 715 under the cantilever. As the cantilever moves down towards the pad, the cantilever shorts two contacts 717a,b and makes an electrical connection. To release the cantilever, the high voltage is removed from the pad and the restoring force of the cantilever lifts the cantilever, acting as a shorting bar, off the contacts. In one implementation the switch comprises an array of corresponding cantilevers, pads, and contacts, with high voltage applied to a particular pad to select one element of the laser array.

There are advantages of a MEMS-based cantilever switch for the tunable laser application. When the device is off and the cantilever is raised, there is very little capacitance between the two sides of the switch. The device also conducts DC as well as RF, and the distance between the pads can be made very small. Any parasitic capacitance between the cantilever and ground, such from the electrostatic pad under the cantilever is largely inconsequential as the switch grounds the lasers anyway.

There are also particular advantages to this implementation. RF MEMS switches typically have lifetime issues when cycled more than a billion times. Since the tunable laser is not expected to switch more than a few thousand times, we do not expect any reliability issues. Furthermore, it is possible to turn off the RF and DC sources prior to switching and therefore "hot switching" is not required. This significantly reduces any chance of a discharge between the contacts in the RF switch that could degrade the performance.

Accordingly, the invention provides for directly modulated tunable lasers. Although the invention has been described with respect to certain embodiments, it should be recognized that the invention may be practiced other than as specifically discussed, for example through the use of insubstantial variations of aspects of embodiments of the invention.

What is claimed is:

1. A directly modulated laser array with a microelectromechanical switch, comprising:
   a laser array on a substrate; and
   a micromechanical switch for allowing provision of an activation signal to a selected laser of the laser array, wherein lasers of the laser array share a common cathode, the microelectromechanical switch is configured to selectively couple both a DC signal source and an RF ground to an anode of the selected laser.

2. The directly modulated laser array with microelectromechanical switch of claim 1 wherein the laser array on a substrate is on a first chip and the microelectromechanical switch is on a second chip, and the first chip and the second chip are flip chipped together.

3. The directly modulated laser array with microelectromechanical switch of claim 1 further comprising a termination resistance approximate the RF ground.

* * * * *